US009426875B2

(12) United States Patent
Sagisaka et al.

(10) Patent No.: US 9,426,875 B2
(45) Date of Patent: Aug. 23, 2016

(54) METHOD FOR PRODUCING PLASMA FLOW, METHOD FOR PLASMA PROCESSING, APPARATUS FOR PRODUCING PLASMA, AND APPARATUS FOR PLASMA PROCESSING

(75) Inventors: Keisuke Sagisaka, Tokyo (JP); Yoshifumi Noguchi, Tokyo (JP)

(73) Assignee: Ferrotec Corporation, Tokyo (JP)

( * ) Notice: Subject to any disclaimer, the term of this patent is extended or adjusted under 35 U.S.C. 154(b) by 694 days.

(21) Appl. No.: 13/642,442

(22) PCT Filed: Apr. 20, 2011

(86) PCT No.: PCT/JP2011/059708
§ 371 (c)(1),
(2), (4) Date: Oct. 19, 2012

(87) PCT Pub. No.: WO2011/132700
PCT Pub. Date: Oct. 27, 2011

(65) Prior Publication Data
US 2013/0034668 A1    Feb. 7, 2013

(30) Foreign Application Priority Data

Apr. 22, 2010    (JP) .................................. 2010-098461

(51) Int. Cl.
| | |
|---|---|
| C23C 14/34 | (2006.01) |
| H05H 1/50 | (2006.01) |
| H01J 37/34 | (2006.01) |
| H01J 37/32 | (2006.01) |
| C23C 14/32 | (2006.01) |

(52) U.S. Cl.
CPC .............. *H05H 1/50* (2013.01); *C23C 14/325* (2013.01); *H01J 37/32055* (2013.01); *H01J 37/3402* (2013.01)

(58) Field of Classification Search
CPC ..................... C23C 14/325; H01J 37/32055
USPC ...................................... 204/192.38, 298.41
See application file for complete search history.

(56) References Cited

U.S. PATENT DOCUMENTS

| | | | |
|---|---|---|---|
| 6,617,538 B1* | 9/2003 | Mahawili | ................. 219/121.36 |
| 2005/0249983 A1* | 11/2005 | Stirniman et al. | ............ 428/834 |
| 2010/0018859 A1* | 1/2010 | Shiina | ..................... 204/298.41 |

FOREIGN PATENT DOCUMENTS

| | | |
|---|---|---|
| JP | 2008-091184 A | 4/2008 |
| JP | 2008-223105 A | 9/2008 |

* cited by examiner

*Primary Examiner* — John Brayton
(74) *Attorney, Agent, or Firm* — Norton Rose Fulbright US LLP

(57) ABSTRACT

Provided are a plasma stream generation method, a plasma processing method, a plasma generation apparatus, and a plasma processing apparatus using same, which enable plasma processing with rotating plasma to be controllably performed with stability and thereby improved in quality. The frequencies in four quadrants Z1-Z4 are set at 7, 15, 6, and 20 Hz, respectively. This frequency variability can realize different rotational velocity of plasma in the four-portion partitioned rotational angle regions. The rotational velocities of plasmas P2, P4 are greater than those of plasmas P1, P3. Thus, the rotating plasma, which rotates at a periodically varied rotational velocity as plasma P1, plasma P2, plasma P3, and plasma P4 in that order while traveling in a circular orbit C, can be used for irradiation therewith, thereby performing uniform film formation treatment in first quadrant Z1 to fourth quadrant Z4.

10 Claims, 12 Drawing Sheets

FIG. 3
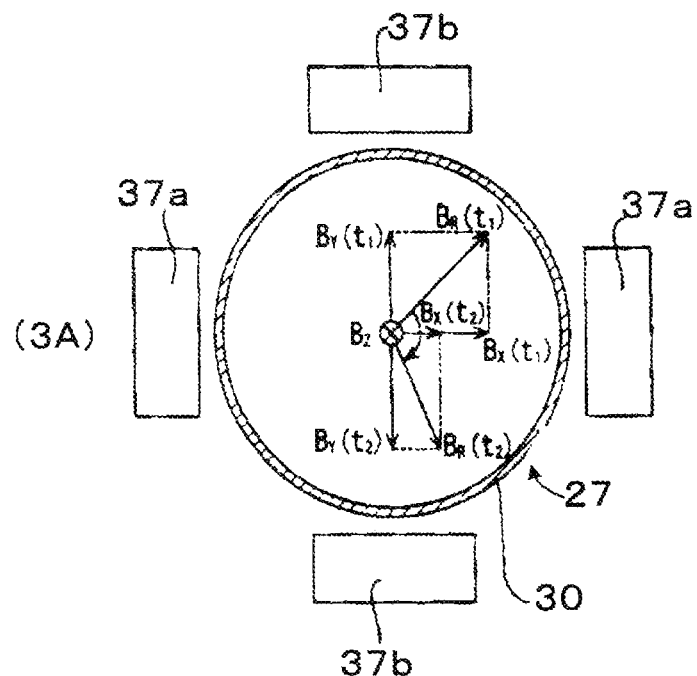
(3A)
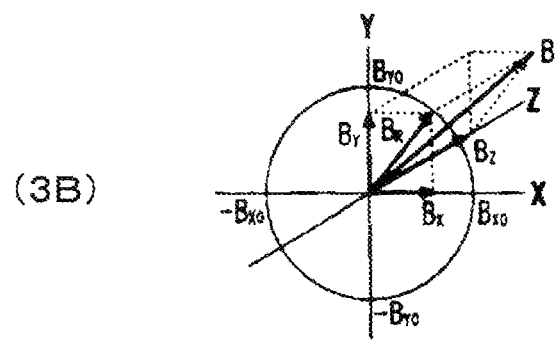
(3B)
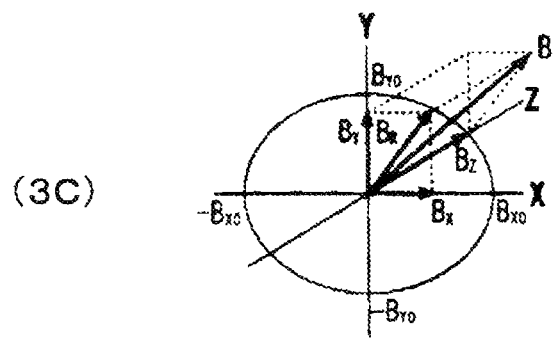
(3C)

FIG.4
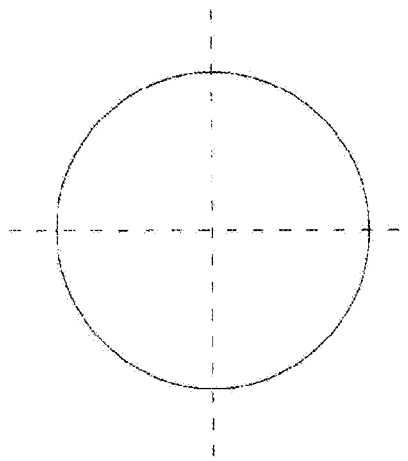
(4B)
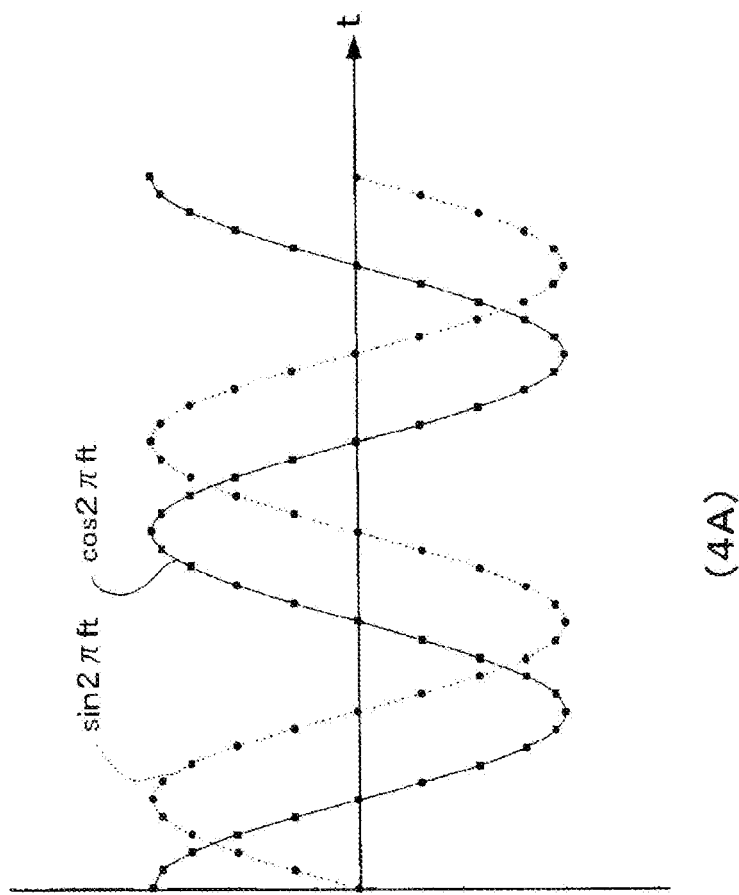
(4A)

FIG. 8
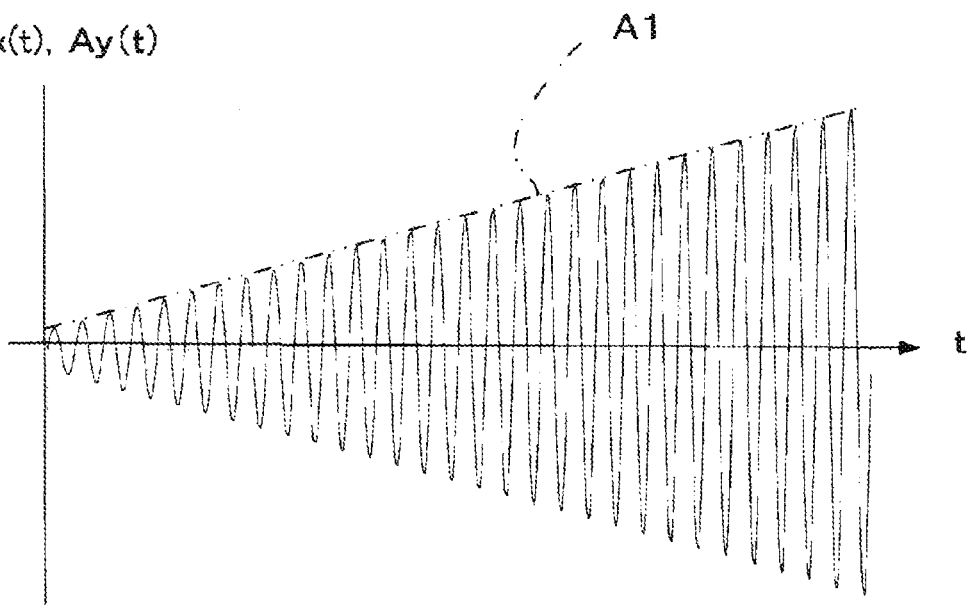
(8A)
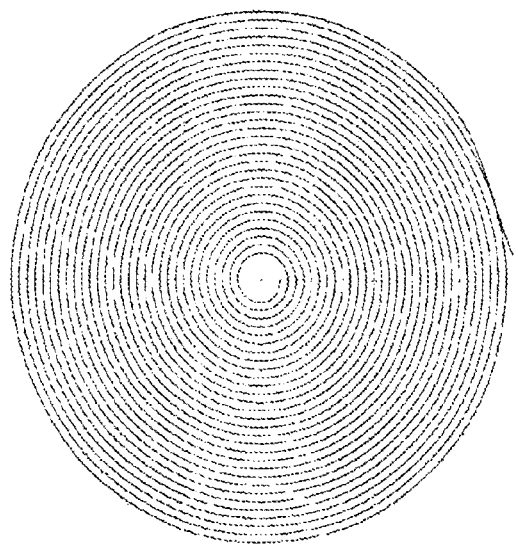
(8B)

FIG. 9
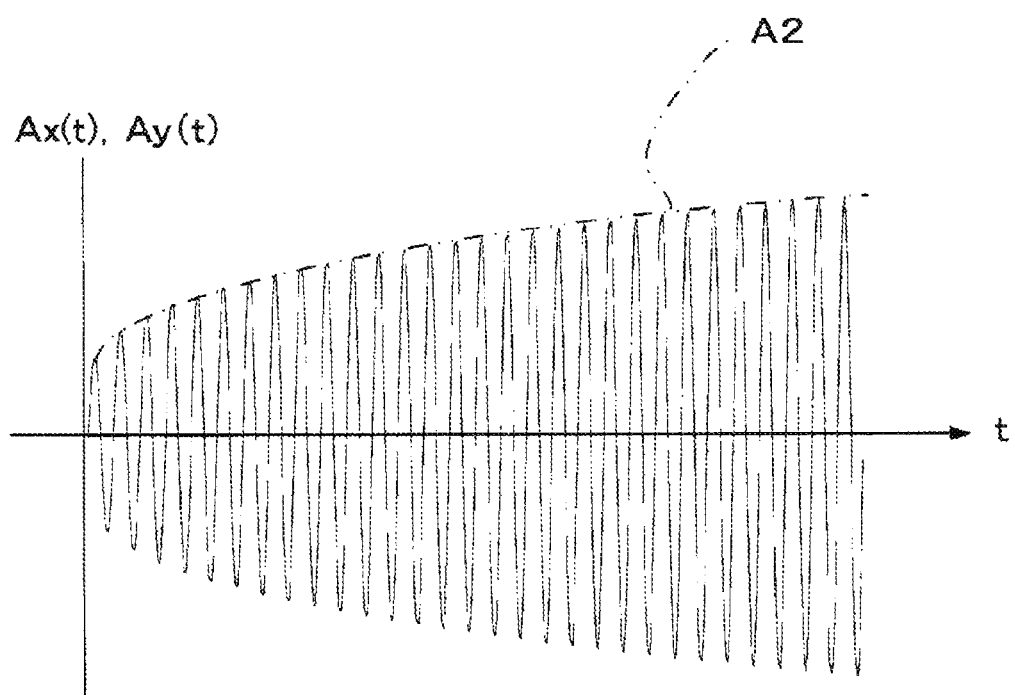
(9A)
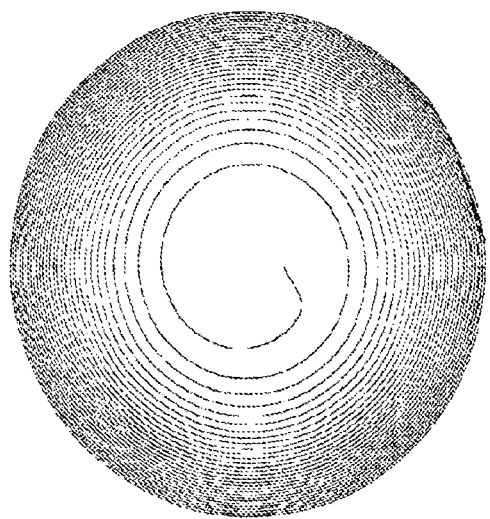
(9B)

FIG. 10
(10A)
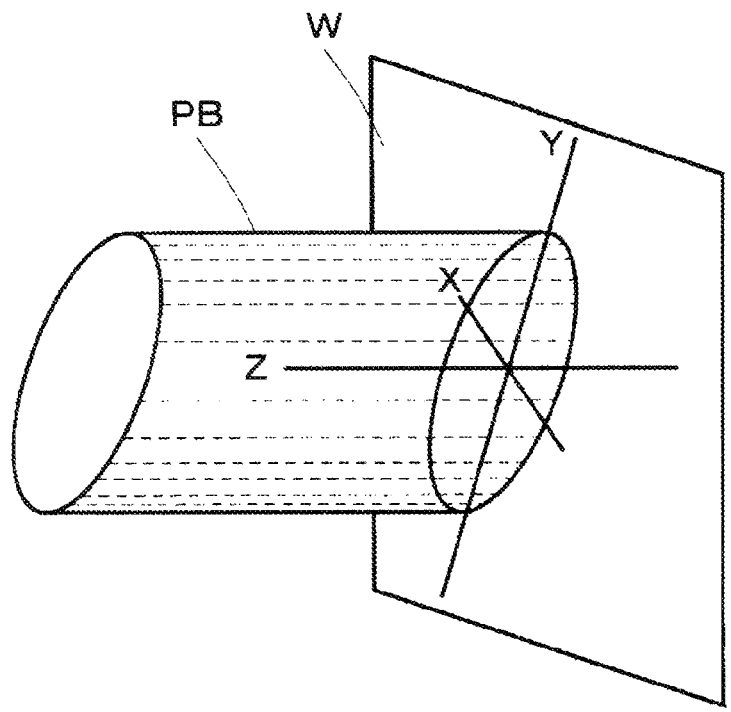
(10B)
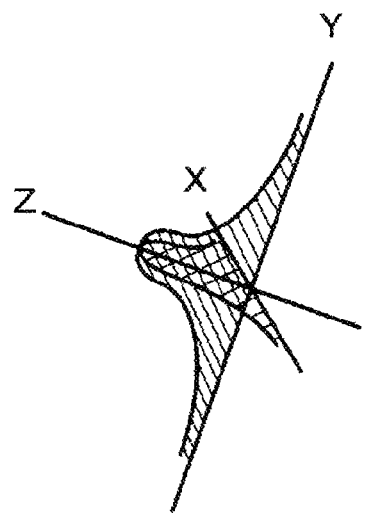

METHOD FOR PRODUCING PLASMA FLOW, METHOD FOR PLASMA PROCESSING, APPARATUS FOR PRODUCING PLASMA, AND APPARATUS FOR PLASMA PROCESSING

FIELD OF THE INVENTION

The present invention concerns a plasma stream generation method, in which a supply source of a plasma constituent material is set up as a cathode, an anode is arranged in front or circumference of said cathode, a plasma is generated by said anode surface by generation of an arc discharge between said cathode and said anode, said anode is rotated, and thus a plasma stream is generated. Also, the present invention concerns a plasma processing method by said rotated plasma stream, a plasma generation apparatus that generates said plasma stream, and a plasma processing apparatus that does a plasma treatment such as film formation by means of the plasma generated by said plasma generation apparatus.

BACKGROUND ART

Commonly, it is known that the solid surface characteristics are improved by forming a thin film on or injecting ions into the surface of a solid material in plasma. A film formed using plasma containing metal ion or nonmetal ion strengthens the abrasion resistance/corrosion resistance of the solid surface, and it is useful as a protective film, an optical film, a transparent electroconductive film and such. In particular, a carbon film using carbon plasma has a high utility value, as diamond-like carbon film (denoted as "DLC") formed from diamond and graphite structures.

As a method for generating plasma containing metal or nonmetal ion, there is a vacuum arc plasma method. Vacuum arc plasma is formed in an arc discharge occurring between a cathode and an anode, where the cathode material evaporates from an existing cathode ray spot on the cathode surface, and it is plasma formed by this vaporized cathode material. Also, when a reactive gas is introduced as the ambient gas, the reactive gas is ionized simultaneously, too. An inert gas (denoted as "noble gas") may be introduced along with said reactive gas, and also, said inert gas can be introduced in place of said reactive gas. By means of such plasma, a surface treatment can be done by thin film formation or ion injection to a solid surface.

Normally, by vacuum arc discharge, from cathode spots, vacuum arc plasma constituent particles are is ejected, such as cathode material ions, electrons, and cathode material neutral atom groups (atoms and molecules). At the same time, cathode material particles, referred to as droplets, with size ranging from less than submicron and up to several hundred microns (0.01-1000 μm), are also ejected. When these droplets adhere to the surface of the object to be treated, the uniformity of the film formed on the surface of the object to be treated is lost, defects of the thin film are caused, and an effect is caused on the surface treatment result of the film formation.

In a plasma processing apparatus using a vacuum arc plasma method, for example, as present applicant already disclosed in Japanese Patent Laid-Open No. 2008-91184 bulletin (Patent Document 1), plasma is generated by inducing an electric spark between the cathode and the trigger electrode, and generating a vacuum arc between the cathode and the anode.

[Patent Document 1] Japanese Patent Laid-Open No. 2008-91184 bulletin

DISCLOSURE OF THE INVENTION

Problems to be Solved by the Invention

In said plasma processing apparatus, as described in Patent Document 1, a deflection magnetic field is generated in the cross section circumferential direction of the plasma transport tube path, so that it is applied to the vacuum arc plasma generated between the cathode and the anode. Then, while rotating the plasma, it is made to travel through the plasma transport tube path, the rotating plasma beam is irradiated to the object to be treated (work), and an efficient film formation treatment is done without causing diffusion.

FIG. 10 shows schematically the beam configuration of vacuum arc plasma. As shown in this FIG. 10A), the beam cross section of plasma beam PB normally is not a perfect circle, but instead it has a substantially elliptical cross section that is deformed, in which an imbalance occurs in the plasma density profile. That is to say, the plasma density distribution, as shown in said FIG. 10B), is distributed so that it is spread in the direction of long axis Y, in comparison with the short axis X-direction. Therefore, when it is irradiated to work W, the irradiation area by the beam in the long-axis Y-direction becomes larger in comparison with the short-axis X-direction.

In the conventional rotation control of a plasma stream, a plasma stream that rotates while describing a circular orbit is generated, and the rotational velocity of the plasma is constant in all regions of the rotation angle region of the plasma around the plasma traveling direction. If the plasma density distribution can be assumed to have a normal distribution that is even toward both the X- and Y-directions, it should be possible to do a film formation that is even along the circumference, by the rotating plasma describing a constant-velocity circular orbit. However, as discussed above, because there is an imbalance in the plasma density profile, the quantity of the beam irradiation irradiated to the work varies along the circumference, causing an issue that the film thickness became uneven. The problem of this unevenness is explained in detail in the following.

FIG. 12 shows schematically the state of a conventional plasma rotation, in which a plasma beam is rotated with a constant velocity. The rotating plasma shown in the figure rotates clockwise from plasma PB1 to PB2, PB3, and PB4, while describing circular orbit C. When each rotation angle region is compared in infinitesimal section ΔR of circular orbit C, because the irradiation time becomes constant in infinitesimal section ΔR under the constant-velocity circular orbit, the thickness of the film formation varied greatly in the regions along the short-axis X-direction or the long-axis Y-direction, due to the imbalance in the plasma density distribution.

In FIG. 12, plasmas PB1 and PB3 are located in rotation angle regions in which the short-axis X-direction is placed on the orbit, and are in positions that are 180° from each other, facing mutually. Plasmas PB2 and PB4 are located in rotation angle regions in which the long-axis Y-direction is placed on the orbit, and are in positions that are 180° from each other, facing mutually, and at the same time, deviate 90° from plasma PB1 and PB3. When plasmas PB2 and PB4 are irradiated to the work, the amount of plasma irradiation is decided by the plasma density distribution that extends toward the long-axis Y-direction. On the other hand, when plasmas PB1 and PB3 are irradiated to the work, the amount of plasma irradiation is decided by the plasma density along the short-axis X-direction that is shorter than the long-axis Y-direction. Therefore, when the rotating plasma that rotates from plasma PB1 to PB2, PB3, PB4 under a constant velocity while describing circular orbit C is irradiated, a clear difference in the film formation thickness occurred between plasmas PB1 and PB3, and plasmas PB2 and PB4. Of course, as a whole circular orbit C, an irregularity in the thickness at various points of the film formation occurs, and a satisfactory plasma treatment could not be done. This irregularity in the film formation thickness varies by the effect of the unevenness in the plasma density profile, and because of this, a rotating plasma control itself for carrying out a desired plasma treatment became difficult.

The object of the invention, in view of said problem, is to provide a plasma stream generation method, a plasma processing method, a plasma generation apparatus, and a plasma processing apparatus using it, in which plasma treatment by a rotating plasma is made stable and controllable, and thereby making it possible to improve the quality of the plasma treatment.

Means to Solve the Problems

The first form of the present invention is a plasma stream generation method, characterized in that a supply source of a plasma constituent material is set up as a cathode, an anode is arranged in front or circumference of said cathode, an arc plasma is generated between said cathode and said anode by generation of an arc discharge, and a plasma stream is generated, rotating around a plasma traveling direction by a rotation magnetic field, wherein a rotation angle region of plasma around said plasma traveling direction is partitioned into two or more, and a rotational velocity of plasma in respective rotation angle region is made to be different.

The second form of the present invention is the plasma stream generation method according to the first form, wherein an X-direction magnetic field set up in a plasma distribution pathway is generated, a Y-direction magnetic field perpendicular to said X-direction is generated, and said X-direction magnetic field and/or said Y-direction magnetic field is varied according to said rotation angle region, thus varying said rotational velocity of a plasma in said rotation angle region, so that a plasma stream describing a circular orbit, an elliptical orbit, or a spiral orbit is generated.

The third form of the present invention is the plasma stream generation method according to the first or second form, wherein said rotation angle region is partitioned into 4n portions (n: positive integer).

The fourth form of the present invention is a plasma processing method, characterized in that a plasma treatment is done by supplying to an object to be treated a plasma stream generated by said plasma stream generation method according to the first, second or third form.

The fifth form of the present invention is the plasma processing method according to the fourth form, wherein when a film is formed on an inner circumference portion and an outer circumference portion of said object to be treated, a plasma treatment is done by a plasma stream having a rotation angle region in which said rotational velocity is different, so that film thicknesses of said inner circumference portion and said outer circumference portion are made to become different.

The sixth form of the present invention is a plasma generation apparatus, characterized in that a supply source of a plasma constituent material is set up as a cathode, an anode is arranged in front or circumference of said cathode, an arc plasma is generated between said cathode and said anode by generation of an arc discharge, and a plasma stream is rotated around a plasma traveling direction by a rotation magnetic field, wherein a rotation angle region of plasma around said plasma traveling direction is partitioned into two or more, and a rotational velocity of plasma in respective rotation angle region is made to be different.

The seventh form of the present invention is the plasma generation apparatus according to the sixth form, wherein said plasma generation apparatus comprises an X-direction magnetic field generating means that generates an X-direction magnetic field set up in a plasma distribution pathway, and a Y-direction magnetic field generating means that generates a Y-direction magnetic field perpendicular to said X-direction, so that said X-direction magnetic field and/or said Y-direction magnetic field is varied according to said rotation angle region, thus varying said rotational velocity of a plasma in said rotation angle region, consequently generating a plasma stream describing a circular orbit, an elliptical orbit, or a spiral orbit.

The eighth form of the present invention is the plasma generation apparatus according to the sixth or seventh form, wherein said rotation angle region is partitioned into 4n portions (n: positive integer).

The ninth form of the present invention is a plasma processing apparatus, characterized in that said plasma processing apparatus comprises said plasma generation apparatus according to the sixth, seventh or eighth form, a plasma transport tube that transports a plasma generated by said plasma generation apparatus, and a plasma processing portion that processes an object to be treated by said plasma supplied from said plasma transport tube.

The tenth form of the present invention is the plasma processing apparatus according to the ninth form, wherein when a film is formed on an inner circumference portion and an outer circumference portion of said object to be treated, film thicknesses of said inner circumference portion and said outer circumference portion are made to become different, by a plasma stream having a rotation angle region in which said rotational velocity is different.

Effects of the Invention

The present invention, as a result of having studied said problem intensively, was done upon observing the fact that uniformization of film growth cannot be achieved by a rotating plasma stream describing a simple constant-velocity circular orbit, due to an imbalance in the plasma density profile. That is to say, according to the first form of the present invention, a rotation angle region of plasma around said plasma traveling direction is partitioned into two or more, and a rotational velocity of plasma in respective rotation angle region is made to be different. Because of this, in contrast with the conventional constant-velocity circular orbit (see FIG. 12), even if there is an imbalance in the plasma density profile, it becomes possible to control the film formation treatment stably, by varying the plasma irradiation time in the divided rotation angle regions. Thus, the quality of plasma treatment can be improved.

According to the second form of the present invention, an X-direction magnetic field set up in a plasma distribution pathway is generated, a Y-direction magnetic field perpendicular to said X-direction is generated, and said X-direction magnetic field and/or said Y-direction magnetic field is varied according to said rotation angle region, thus varying said rotational velocity of a plasma in said rotation angle region, so that a plasma stream describing a circular orbit, an elliptical orbit, or a spiral orbit is generated. Because of this, film formation treatment using a desired plasma exposure configuration can be done, depending on the irradiation condition of plasma.

According to the third form of the present invention, said rotation angle region is partitioned into 4n portions (n: positive integer). Because of this, by arranging, for example, a magnetic field generating means that generates an X-direction magnetic field, together with a Y-direction magnetic field perpendicular to the X-direction, in the outer circumference of the plasma distribution tube passage, the rotational velocity of the plasma is made to be different in respective rotation angle regions that has been partitioned into 4n (n: positive integer) portions. Therefore, a film formation treatment can be controlled stably by varying the plasma exposure time in the multiply divided rotation angle regions, even if there is an imbalance in the plasma density profile.

According to the fourth form of the present invention, a plasma treatment is done by supplying to an object to be treated a plasma stream generated by the plasma stream generation method according to the first, second or third form. Because of this, by said plasma stream generation method, plasma can be irradiated onto said object to be treated as a rotating plasma stream in which the rotational velocity in each rotation angle region is made to be different. This way, a plasma treatment of superior quality can be done without producing an irregularity in the film formation thickness, by controlling the film formation treatment stably.

In the present invention, the film formation treatment can be controlled stably, by varying the plasma exposure time in the multiply divided rotation angle regions. Because of this, not only the film formation treatment can be done homogeneously throughout the whole object to be treated, but also, even in the inner and outer circumferences of the object to be treated, a plasma treatment can be done in one step, in which a desired difference in height is imparted precisely to the film formation thickness, by varying the plasma exposure time. That is to say, according to the fifth form of the present invention, when a film is formed on an inner circumference portion and an outer circumference portion of said object to be treated, a plasma treatment is done by a plasma stream having a rotation angle region in which said rotational velocity is different, so that film thicknesses of said inner circumference portion and said outer circumference portion are made to become different. Because of this, for example, one may consider a case in which a medium for a hard disk drive is used as the object to be treated, and the film is formed more thickly at the load-unload zone at the outer circumference side that requires durability higher than the data zone at the inner circumference side. Previously, two steps were required, in which after a film is formed on the whole disc once, another film formation is done again at the outer circumference portion for thickness. In contrast, by the single plasma treatment step, a plasma treatment can be done, in which a desired height difference is provided in the film formation thicknesses at the inside and the outside circumferences, in high quality.

According to the sixth form of the present invention, a rotation angle region of plasma around said plasma traveling direction is partitioned into two or more, and a rotational velocity of plasma in respective rotation angle region is made to be different. Because of this, even if there is an imbalance in the plasma density profile, it becomes possible to control the film formation treatment stably, by varying the plasma irradiation time in the divided rotation angle regions. Thus, it becomes possible to provide plasma generating in which the quality of plasma treatment can be improved.

According to the seventh form of the present invention, said plasma generation apparatus comprises an X-direction magnetic field generating means that generates an X-direction magnetic field set up in a plasma distribution pathway, and a Y-direction magnetic field generating means that generates a Y-direction magnetic field perpendicular to said X-direction, so that said X-direction magnetic field and/or said Y-direction magnetic field is varied according to said rotation angle region, thus varying said rotational velocity of a plasma in said rotation angle region, consequently generating a plasma stream describing a circular orbit, an elliptical orbit, or a spiral orbit. Because of this, it becomes possible to provide a plasma generation apparatus, in which film formation treatment using a desired plasma exposure configuration can be done, depending on the irradiation condition of plasma.

According to the eighth form of the present invention, said rotation angle region is partitioned into 4n portions (n: positive integer). Because of this, by arranging, for example, a magnetic field generating means that generates an X-direction magnetic field, together with a Y-direction magnetic field perpendicular to the X-direction, in the outer circumference of the plasma distribution tube passage, the rotational velocity of the plasma is made to be different in respective rotation angle regions that has been partitioned into 4n (n: positive integer) portions. Therefore, a plasma generation apparatus can be realized, in which it is possible to control stably a film formation treatment by varying the plasma exposure time in the multiply divided rotation angle regions, even if there is an imbalance in the plasma density profile.

According to the ninth form of the present invention, by the plasma generation apparatus according to the sixth, seventh or eighth form, a rotating plasma is generated, in which an irradiation time is varied depending on multiply divided rotation angle regions, and film formation treatment can be done by this rotating plasma supplied to said plasma processing portion via said plasma transport tube. Because of this, a plasma treatment of superior quality can be done.

According to the tenth form of the present invention, when a film is formed on an inner circumference portion and an outer circumference portion of said object to be treated, film thicknesses of said inner circumference portion and said outer circumference portion are made to become different, by a plasma stream having a rotation angle region in which said rotational velocity is different. Because of this, for example, one may consider a case in which a medium for a hard disk drive is used as the object to be treated, and the film is formed more thickly at the load-unload zone at the outer circumference side that requires durability higher than the data zone at the inner circumference side. Previously, two steps were required, in which after a film is formed on the whole disc once, another film formation is done again at the outer circumference portion for thickness. In contrast, by the single plasma treatment step, a plasma treatment can be done, in which a desired height difference is provided in the film formation thicknesses at the inside and the outside circumferences, in high quality. Therefore, a plasma processing apparatus can be provided, in which such plasma treatment can be done.

BRIEF DESCRIPTION OF THE DRAWINGS

FIG. 3 is a figure showing a configuration of magnetic field generator for plasma rotation 37, and a rotation magnetic field generated by magnetic field generator for plasma rotation 37.

FIG. 4 is an electric current control waveform diagram for describing a simple circle, and a circular Lissajous figure.

FIG. 8 is a waveform diagram of the pulse electric current for a spiral orbit, and a Lissajous figure of rotating plasma describing a spiral orbit.

FIG. 9 is a waveform diagram of the pulse electric current for a different spiral orbit, and a Lissajous figure of rotating plasma describing a spiral orbit.

FIG. 10 is a figure showing schematically the beam configuration of vacuum arc plasma.

BEST MODE FOR CARRYING OUT THE INVENTION

In the following, the plasma generation apparatus and plasma processing apparatus concerning an embodiment of the present invention is explained in detail based on the attached figures.

Figure 1:
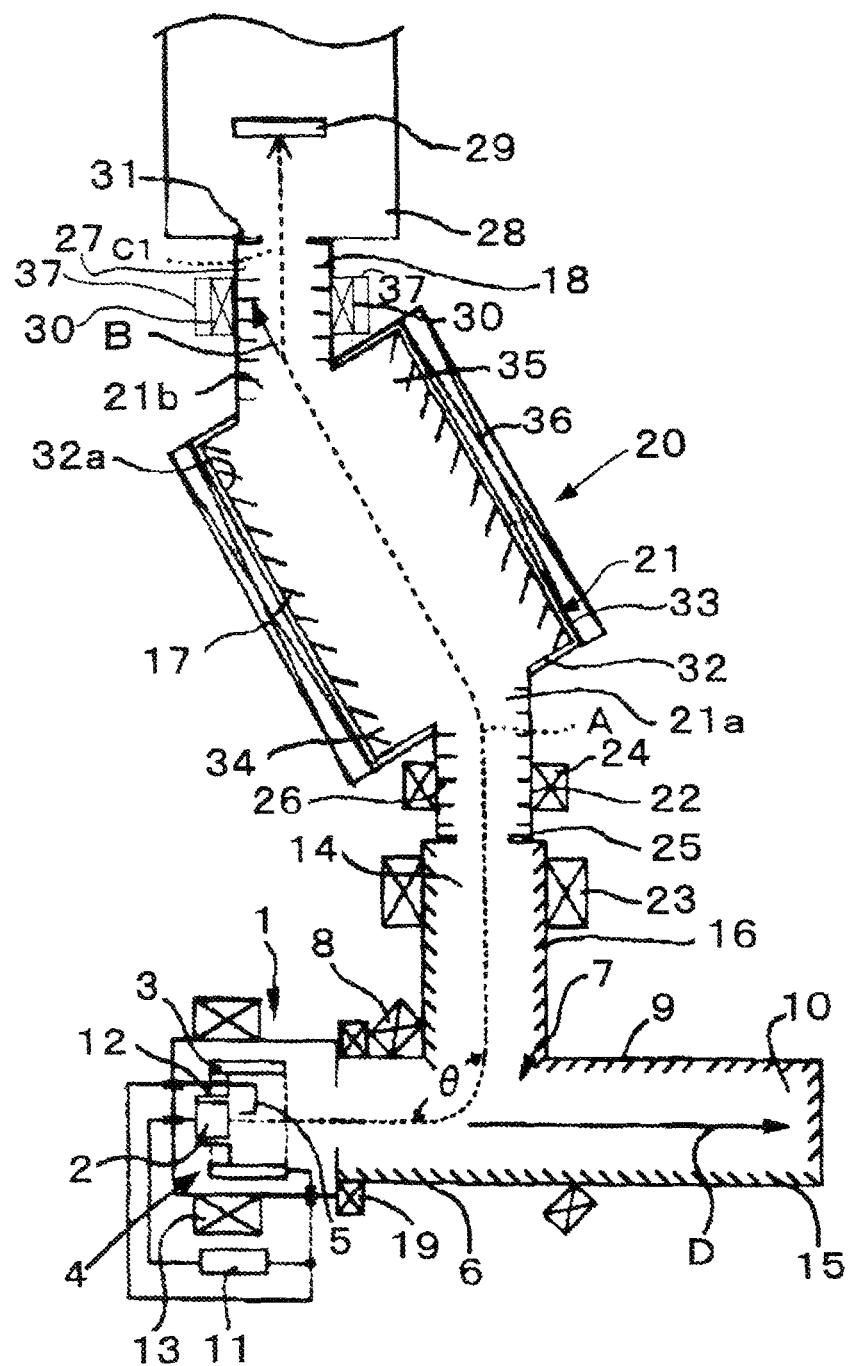
FIG. 1 is a cross section outlined schematic diagram of a plasma processing apparatus to which a plasma generation apparatus concerning an embodiment of the present invention has been installed.

FIG. 1 is a cross section outlined schematic diagram of a plasma processing apparatus to which plasma generation apparatus 1 concerning the present invention has been installed. In plasma generating portion 4, the supply source of a plasma constituent material set up as cathode (target) 2, and a tube-like anode 3 is set up at the front side of cathode 2. In plasma generating portion 4, striker 5 of a trigger electrode, arc power supply 11, cathode protector 12, and plasma stabilizing magnetic field generator (electromagnetic coil or magnet) 13 are installed. Striker 5 is arranged freely rotatably, so that it can approach toward and reverse from cathode 2. An electric spark is generated between cathode 2 and striker 5 under a vacuum atmosphere, a vacuum arc is generated between cathode 2 and anode 3, and thus plasma is generated.

In the plasma processing apparatus concerning the present embodiment, plasma treatment is done by introducing rotating plasma stream generated by the plasma stream generation method of the present invention into plasma treatment chamber 28. Generation of said rotating plasma stream is done by introducing the plasma generated between cathode 2 and anode 3 through plasma distribution pathway into discharge side radially reduced tube 27 positioned in the plasma stream entrance of plasma treatment chamber 28, applying rotation magnetic field, and rotating around the plasma traveling direction. In this instance, the rotation angle region of the plasma around said plasma traveling direction is partitioned into two sections or more by the rotation magnetic field control. Thus, a rotating plasma stream is generated, in which the rotational velocity of the plasma in respective rotation angle region is different. It is introduced into plasma treatment chamber 28 toward plasma stream entrance shown by broken line C1. For the rotation configuration of the rotating plasma stream, a plasma stream describing a circular orbit, an elliptic orbit, or a spiral orbit can be generated, depending on the control of the rotation magnetic field, and therefore a film formation treatment under an intended plasma exposure configuration can be done, depending on the irradiation condition of the plasma.

Cathode 2 is the supply source of the plasma constituent material. Its formation material is not limited in particular, as long as it is a solid having electroconductivity. An elemental metal, an alloy, an elemental inorganic substance, and/or an inorganic compound (metal oxide/nitride) can be used individually, or as a mixture of two kinds or more. As for the formation material of anode 3, an electroconductivity material that is a nonmagnetic substance and does not evaporate even at the plasma temperature, can be used. By the vacuum arc discharge in plasma generating portion 4, vacuum arc plasma constituent particles, such as target material ion, electron, and cathode material neutral particles (atoms and molecules), are ejected. Also, at the same time, cathode material particles (referred subsequently to as "droplets D"), whose size ranges from less than or equal to submicron and up to several hundred microns (0.01-1000 μm), are also ejected. The generated plasma advances along plasma advancing path 6, is bent by angle θ toward connecting advancing path 14 by means of a magnetic field formed by bending magnetic field generators 8, 8 in bending portion 7, and advances toward connecting advancing path 14. At that instance, droplets D are neutral electrically, and because they do not receive influence of a magnetic field, they advance straightly along droplet advancing path 9, and are collected to droplet collecting portion 10. In addition, in the inner wall of each advancing path of droplet advancing path 9, baffles 15, 16, 17, 18, and 26 are installed, where droplets D collide and adhere. In addition, in the starting end side of plasma advancing path 6, magnetic field generator 19 that generates a plasma advancing magnetic field is set up.

Connecting advancing path 14 comprises a tube passage to which several baffles 16 have been installed on the inner wall, and it is connected to radially enlarged tube 21 that forms plasma advancing path 20. Connecting advancing path 14 includes introduction side radially reduced tube 22 connected to plasma introduction side starting end 21a of radially enlarged tube 21. Aperture for droplet capture 25 is installed at the step portion with introduction side radially reduced tube 22 at the center of connecting advancing path 14. To the starting end side of connecting advancing path 14 and introduction side radially reduced tube 22, magnetic field generators 23, 24 respectively are set up, for generating a plasma advancing magnetic field. Several baffles 26 are installed in the inner wall of introduction side radially reduced tube 22.

In plasma discharge side finishing end 21b of radially enlarged tube 21, discharge side radially reduced tube 27 is connected. The outlet of discharge side radially reduced tube 27 is connected to plasma treatment chamber (plasma treatment portion) 28, and to its connecting portion, aperture 31 is installed. To discharge side radially reduced tube 27, magnetic field generator 30 that generates a plasma advancing magnetic field, and magnetic field generator 37 for plasma rotation, are set up. In plasma treatment chamber 28, object to be treated 29 is set up at a position where the plasma introduced from discharge side radially reduced tube 27 is irradiated.

Radially enlarged tube 21 comprises inner circumferential tube 32 and outer circumferential tube 33, and it is inclinedly arranged with respect to introduction side radially reduced tube 22 and discharge side radially reduced tube 27. Outer circumferential tube 33 does not participate in traveling of the plasma stream, but instead it is a protection member of inner circumferential tube 32. Inner circumferential tube 32 is mounted in outer circumferential tube 33 through an insulation material such as an insulating ring, and it is insulated electrically from inner circumferential tube 32 and outer circumferential tube 33. Several baffles 17 are installed in the wall surface of inner circumferential tube 32. In the outer circumference of outer circumferential tube 33, straightly advancing magnetic field generator 36 generating a plasma advancing magnetic field is set up. Straightly advancing magnetic field generator 36 is composed of an electromagnetic coil wound around the outer circumference of outer circumferential tube 33.

In FIG. 1, broken line A shows the traveling direction of the plasma. The plasma that has passed through connecting advancing path 14 passes through introduction side radially reduced tube 22, and advances inside radially enlarged tube 21 of plasma advancing path 20. At that instance, the remaining droplets D collide with and adhere to baffle 17, and are removed. Furthermore, the plasma bends from plasma advancing path 20 and is introduced into discharge side radially reduced tube 27, and as shown by broken line C1, it is introduced into plasma treatment chamber 28 through discharge side radially reduced tube 27.

The plasma stream introduced in radially enlarged tube 21 from introduction side radially reduced tube 14 is diffused by the diameter-enlarging effect of the plasma advancing path by radially enlarged tube 21. Because the droplets mixed with the plasma stream advance straightly, they diffuse while colliding with the tube inner wall surface of radially enlarged tube 21 that has been inclinedly arranged. By this diffusion, the droplets decrease in number at the central portion of the plasma stream, and it transitions to a state in which many droplets are distributed at the outer circumference of the plasma stream. By this change in distribution, the droplets collide toward nearby step portions 34, 35 of radially enlarged tube 21 and the inner wall surface of inner circumferential tube 32, and are adhered and collected. Furthermore, when they are discharged to discharge side radially reduced tube 27 connected in a bent manner to plasma discharge side finishing end 21b, the droplets advancing straightly toward the direction of arrow B collide with baffle 18, and are adhered and removed.

To plasma treatment chamber 28, reactive gas is introduced as necessary by a gas introduction system (not shown), and the reaction gas and the plasma stream are exhausted by a gas exhaust system (not shown). In addition, in the present embodiment, the plasma distribution pathway is formed by setting up a multiply bent advancing path between plasma generating portion 4 and plasma treatment chamber 28. However, the present invention is not limited to this, but it can be applied toward various plasma processing apparatuses having a substantially L-shaped advancing path.

Figure 2:
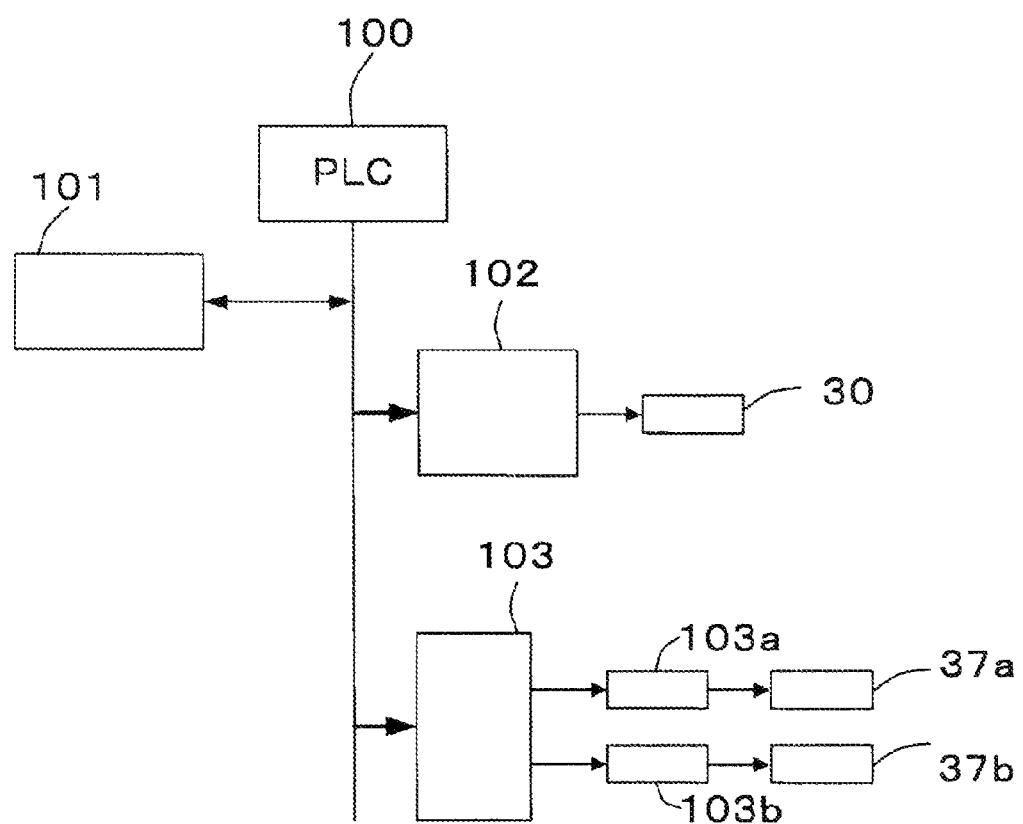
FIG. 2 is a control block diagram of said plasma processing apparatus.

FIG. 2 shows a control block diagram of said plasma processing apparatus. In FIG. 2, mainly control circuits necessary for the plasma rotation concerning the present invention is shown, and a striker drive control circuit, and a straightly advancing magnetic field control circuit, among others, are omitted. The control unit of the plasma processing apparatus comprises programmable logic controller (PLC) 100. Touch panel display 101 is connected to PLC 100, and display output and setting input are enabled by touch panel display 101. In PLC 100, a plasma rotation control program is stored, and pulse generator 103 is connected, driven and controlled by this plasma rotation control program. The pulsed output of pulse generator 103 go through DC servo amplifier 103a, 103b, and is directed toward oscillating magnetic field generator 37a and oscillating magnetic field generator 37b. In addition, direct current regulated power supply 102 is connected to PLC 100, and the power output of direct current regulated power supply 102 is directed toward straightly advancing magnetic field generator 30.

FIG. 3 shows the configuration of magnetic field generator for plasma rotation 37, and the rotation magnetic field generated by magnetic field generator for plasma rotation 37. Magnetic field generator 37 comprises, oscillating magnetic field generator 37a that generates oscillating magnetic field $B_X$ of the X-axis direction, and oscillating magnetic field generator 37b that generates oscillating magnetic field $B_Y$ of the Y-axis direction. These magnetic field generators are arranged so that oscillating magnetic field $B_X$ and oscillating magnetic field $B_Y$ are perpendicular with respect to radially enlarged tube 21. Straightly advancing magnetic field $B_Z$ of the Z-axis direction is formed by straightly advancing magnetic field generator 36. As a specific example of a rotation magnetic field generating means of the present invention, a combination of oscillating magnetic field generator 37a and oscillating magnetic field generator 37b is given, and the rotation magnetic field comprises a synthetic magnetic field of oscillating magnetic field $B_X$ and oscillating magnetic field $B_Y$. Oscillating magnetic field generator 37a and oscillating magnetic field generator 37b comprises an electromagnetic coil generating a deflection magnetic field (subsequently referred to as "deflection coil"). In addition, straightly advancing magnetic field generator 30 is composed of an electromagnetic coil wound around the outer circumference of discharge side radially reduced tube 27.

(3B) shows the relation between oscillating magnetic field $B_X(t)$ at time t by oscillating magnetic field generator 37a, oscillating magnetic field $B_Y(t)$ at time t by oscillating magnetic field generator 37b, and rotation magnetic field $B_R(t)$ at time t. FIG. 3 shows magnetic field applied to one location where the plasma stream in radially enlarged tube 21 passes, and straightly advancing magnetic field $B_Z$ is made to be a steady magnetic field. The straightly advancing magnetic field can also be varied with time. Rotation magnetic field $B_R(t_1)$ is synthesized from oscillating magnetic fields $B_X(t_1)$ and $B_Y(t_1)$ at time $t=t_1$.

As shown in (3B) and (3C) (description of time (t) is omitted), synthetic magnetic field B is synthesized from said rotation magnetic field $B_R$ and straightly advancing magnetic field $B_Z$. Said droplets-mixed plasma 9 is bent toward the direction of synthetic magnetic field B, and advances through said discharge side radially reduced tube 27. Similarly, in (3A), rotation magnetic field $B_R(t_2)$ is synthesized from oscillating magnetic fields $B_X(t_2)$ and $B_Y(t_2)$ at time $t=t_2$. That is to say, when time t advances from $t_1$ to $t_2$, oscillating magnetic fields $B_X(t_1)$, $B_Y(t_1)$ change to oscillating magnetic fields $B_X(t_2)$, $B_Y(t_2)$, and said rotation magnetic field $B_R(t)$ rotates from $B_R(t_1)$ to $B_R(t_2)$. Therefore, by adjusting the phase difference, frequency and amperage of the pulsed current toward oscillating magnetic field generators 37a, 37b, and controlling oscillating magnetic fields $B_X(t)$, $B_Y(t)$, a desired rotation magnetic field $B_R(t)$ can be generated. By the way, the time notation (t) is omitted subsequently, and the notation will be oscillating magnetic fields $B_X$, $B_Y$, and rotation magnetic field $B_R$.

(3B) and (3C) shows the relation between oscillating magnetic fields $B_X$, $B_Y$, straightly advancing magnetic field $B_Z$, rotation magnetic field $B_R$, and synthetic magnetic field B. In (3B), amplitude $B_{X0}$ of oscillating magnetic field $B_X$ and amplitude $B_{Y0}$ of oscillating magnetic field $B_Y$ are set to same value, and by oscillating magnetic fields $B_X$, $B_Y$ with 90° phase difference oscillating at same frequency, rotation magnetic field $B_R$ rotates with a constant strength. Therefore, plasma stream 38 advances through discharge side radially reduced tube 27 while rotating in circle. In (3C), amplitude $B_{Y0}$ is set to be smaller than amplitude $B_{X0}$, and in the same manner as (3B), by making oscillating magnetic fields $B_X$, $B_Y$ with 90° phase difference oscillate in a same frequency, the vector of rotation magnetic field $B_R$ in (3C) rotates in elliptic shape.

Figure 11:
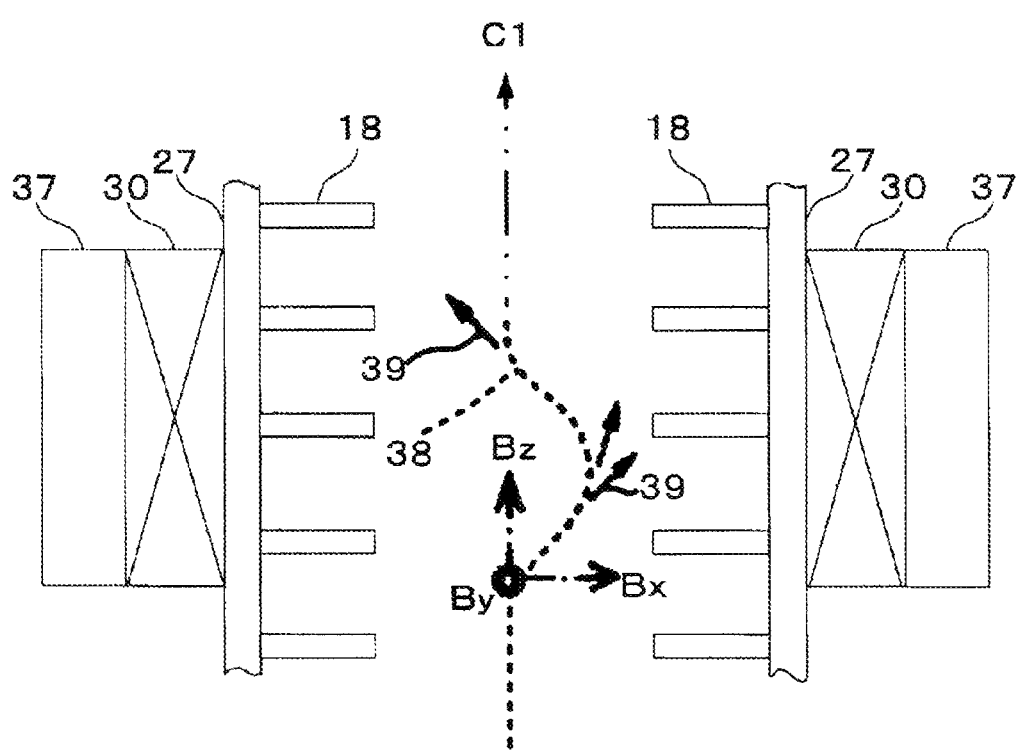
FIG. 11 is a figure for explaining a rotating plasma stream generated by magnetic field generator for plasma rotation 37.

FIG. 11 schematically shows plasma stream 38 inside discharge side radially reduced tube 27.

Plasma stream 38 inside discharge side radially reduced tube 27 curves through the rotation effect of said rotation magnetic field $B_R$, and while separating the droplets toward the direction of the wall side shown by arrow 39, it become a rotating plasma stream, and advances to introduction direction C1 toward plasma treatment chamber 28.

As shown in FIG. 2, the power control of oscillating magnetic field generator 37a and oscillating magnetic field generator 37b to the electromagnetic coils is done individually by the current supply from DC servo amplifiers 103a, 103b that varies the energization quantity, based on the pulse signal generated by pulse generator 103. Pulse generator 103 generates pulse signal, as the plasma rotation control program is executed by PLC 100. The control of the power from straightly advancing magnetic field generator 30 to the electromagnetic coil is done by the power feed from direct current regulated power supply 102 that is driven and controlled by PLC 100.

To each deflecting coil, sinusoidal current is supplied through DC servo amplifier 103a, 103b. Principle of plasma rotation control by feed of sinusoidal current is easily explained in the following. When sinusoidal current is expressed as Am sin $2\pi$ ft (Am: amplitude; f: frequency; t: time), the magnetic field formed by the deflecting coil when this sinusoidal current is conducted through the deflecting coil is zero at the time of $2\pi f = n\pi$. At the time of $2\pi f = n\pi/2s$, it becomes 1 if n is an odd number, and −1 if it is an even number, and thus the direction of the magnetic field changes. As shown in (4A) of FIG. 4, for example, when a waveform electric current is supplied to each deflecting coil, and the waveform is sin $2\pi$ft and cos $2\pi$ft whose amplitudes are same but whose phases are different, the plasma stream rotates so as to describe a Lissajous figure of sin $2\pi$ft, cos $2\pi$ft, that is to say, a circle as shown in (4B) of FIG. 4. By the way, as already mentioned as a problem, if the plasma is rotated while frequency f is made uniform so that it describes a circular orbit, the rotational velocity of the plasma becomes equal in all the regions among the rotation angle regions of the plasma around the plasma traveling direction.

In the present invention, it has been observed that the orbiting speed of the plasma is determined by frequency f of the pulsed current from DC servo amplifiers 103a, 103b. The rotation angle region of the plasma around the plasma traveling direction is partitioned into two or more portions, and electric current control is done to make different the rotational velocity of plasma in respective rotation angle region. This is done by partitioning said rotation angle region into 4n (n: positive integer) portions.

Figure 5:
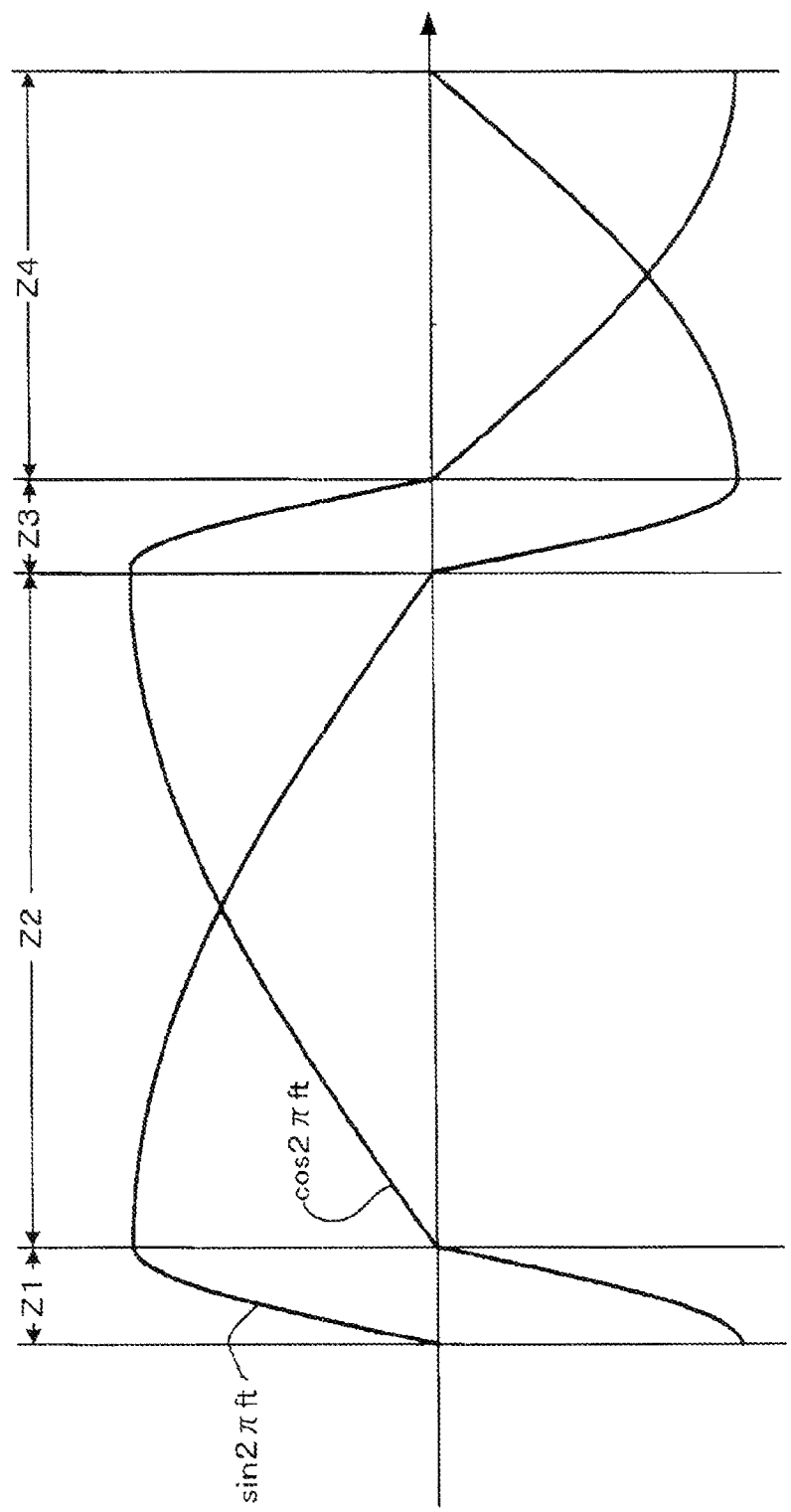
FIG. 5 is a pulse electric current waveform diagram of the present embodiment, caused by a frequency variation.

The present embodiment corresponds to a case in which the rotation angle region is partitioned into four portions. FIG. 5 shows a pulse electric current waveform diagram of the present embodiment, caused by a frequency variation.

Respective frequency in the four quadrants Z1-Z4 is set to 7, 15, 6, 20 Hz. By this frequency variation setting, the rotational velocity of plasma in the rotation angle region partitioned four-fold can be made different. Previously, because in each quadrant, frequency f of the pulse current has been set to be a constant value, for example, 10 Hz, the rotational velocity of plasma was constant, as discussed above. However, according to the present embodiment, by varying the plasma irradiation time in the partitioned rotation angle regions, the film formation treatment can be controlled stably even if there is a variation in the plasma density profile, and thus the quality of the plasma treatment can be improved.

Figure 6:
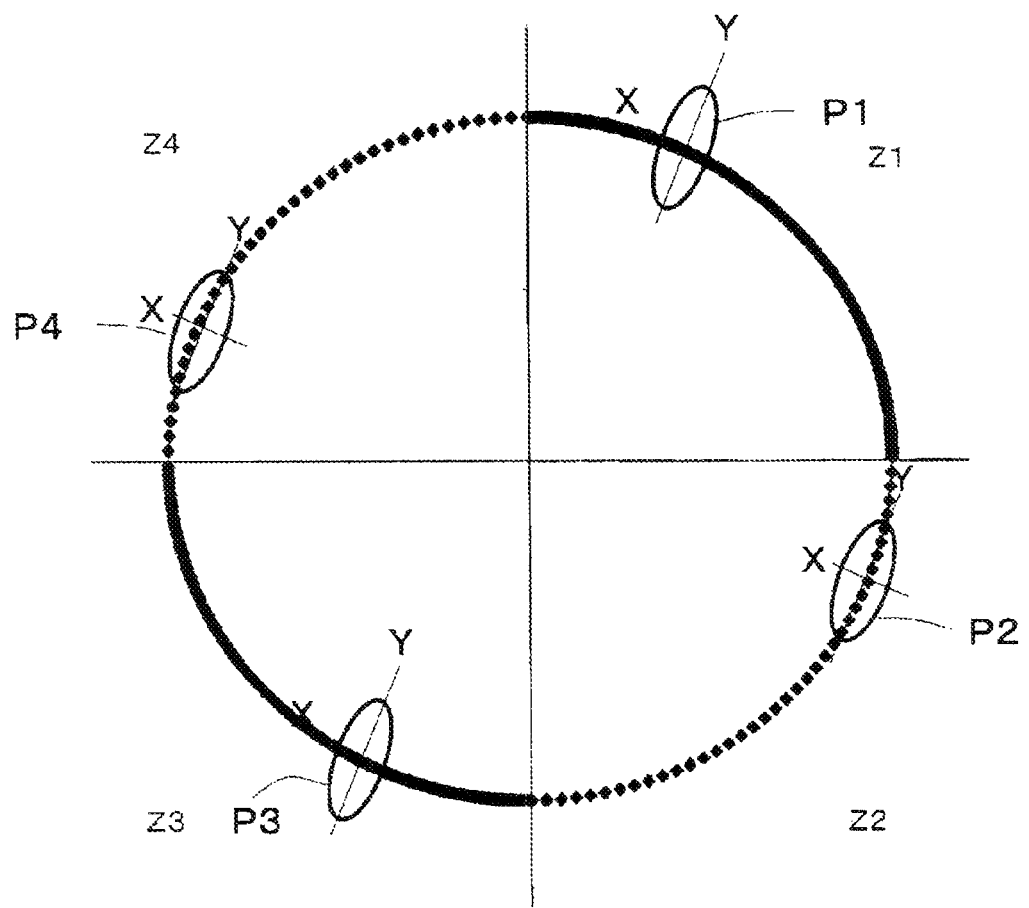
FIG. 6 is a circular Lissajous figure by a four-fold partition of FIG. 5.

FIG. 6 shows the Lissajous figure from the four-fold partition of FIG. 5. Although the plasma stream rotates so that it describes a circle, the rotational velocities in the four quadrants Z1-Z4 are different. In other words, the orbiting speed is slow in first quadrant Z1 and third quadrant Z3, and the orbiting speed is fast in second quadrant Z2 and fourth quadrant Z4. In FIG. 6, the fast orbiting speed in quadrants Z2, Z4 is illustrated by dot depiction.

In FIG. 6, P1-P4 shows the orbiting position in each quadrant of the plasma stream with variation in the plasma density profile. P1 and P3 are located in the rotation angle regions where the shortened-axis X-direction is in the orbit, and are at locations where they face each other in 180°. Plasma P2 and P4 are located in the rotation angle region where there is an extended-axis Y-direction is in the orbit, face each other at 180°, and, deviates 90° from plasma P1 and P3. When plasma P2 and P4 are irradiated onto the work, the amount of the plasma exposure is determined by the plasma density profile that spreads along the extended axis Y-direction. On the other hand, when plasma P1 and P3 are irradiated onto the work, the amount of the plasma exposure is determined by the plasma density profile of the shortened-axis X-direction that is smaller than the extended-axis Y-direction. In the present embodiment, the orbiting speed of plasma P2 and P4 is faster than plasma P1 and P3. Because of this, by irradiating with the rotating plasma that rotates periodically from plasma P1 to P2, P3, P4 while varying its velocity describing circular orbit C, a uniform film-forming process can be done in the range from first quadrant Z1 to fourth quadrant Z4. Within a whole circular orbit, an irregularity in the thickness at the film formation points does not occur, and a satisfactory plasma treatment can be done. Moreover, a control of the rotating plasma for carrying out a desired plasma treatment, in which an effect from an unevenness of the plasma density profile is not seen, and uneven spots in the film formation thickness are not formed, can be done simply by means of frequency variation.

Figure 7:
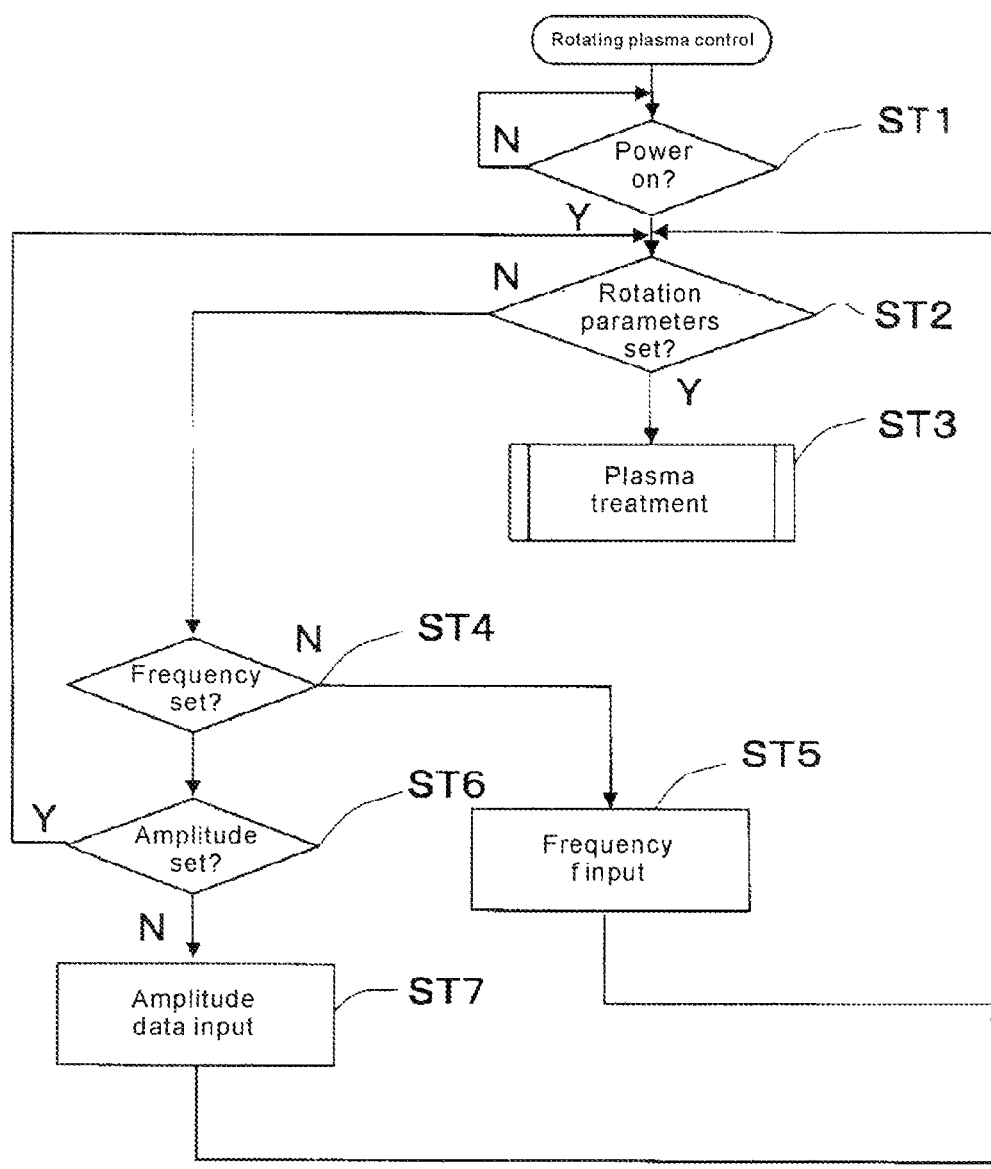
FIG. 7 is a basic flow chart of a rotating plasma control concerning the present invention.

FIG. 7 is a basic flow chart of a rotating plasma control concerning the present invention. The control of the rotating plasma generation concerning the present invention comprises PLC 100 and the execution process of frequency variation control executed by PLC 100. By an input from the apparatus power supply (step ST1), a configuration setting treatment of various parameters for the rotating plasma is done, preceding the plasma treatment (step ST2). The rotation control parameter comprises frequency f and amplitude data. The amplitude data is necessary for later multiorbital control. If these various parameters are set, irradiation treatment of an object to be treated by the rotating plasma becomes possible to carry out (step ST3).

If rotation control parameter is not set yet, setting of frequency f is done (steps ST4, ST5). Upon setting frequency f, the frequency for each rotation angle region is set according to the number of partitions 4n. In addition, one proceeds to configuration of the amplitude data, and according to the multiorbital control, the amplitude data is input and set (steps ST6, ST7). The setting of these various parameters can be done by means of touch panel display 101.

Figure 12:
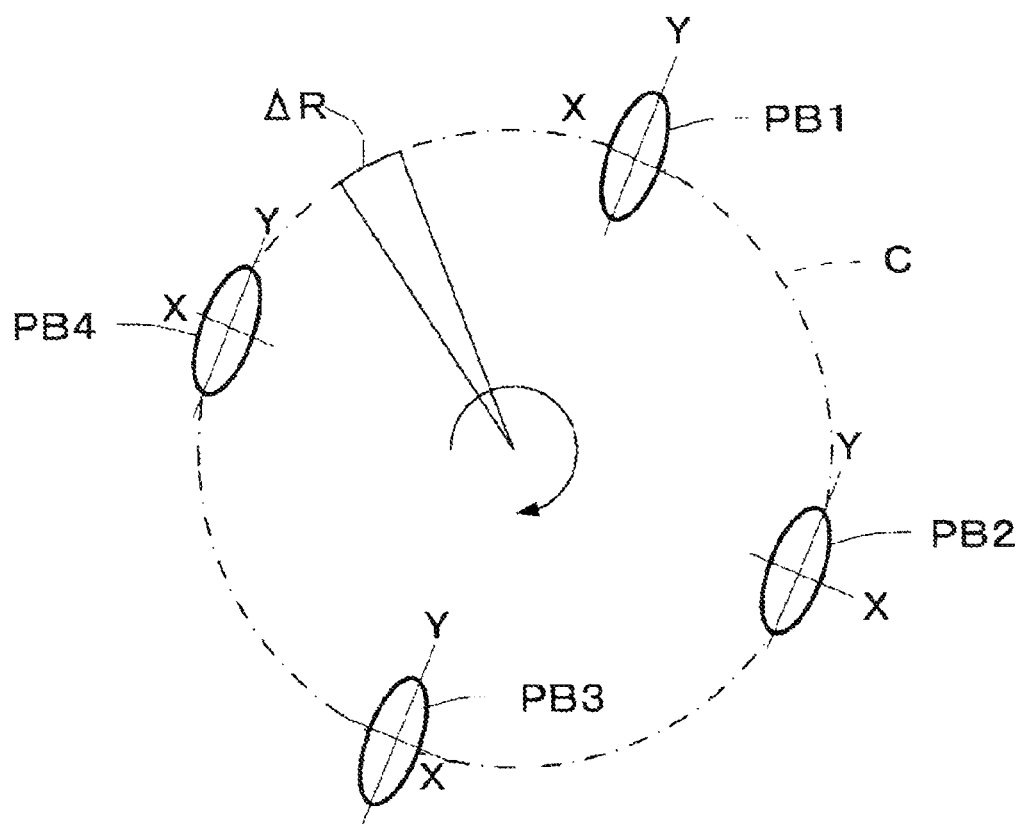
FIG. 12 is a figure showing schematically the state of a conventional plasma rotation.

In a conventional constant-velocity rotating plasma, as explained by FIG. 12, irregular spots of film formation thickness occurred in the object to be treated. However, if the generation method of rotating plasma concerning the present invention is used, an evenness of film formation can be realized by doing rotating plasma control for describing multiple orbits. A rotating plasma describing multiple orbits can be generated by changing with respect to time the amplitude of the pulse current supplied to each deflecting coil from DC servo amplifiers 103a, 103b.

FIG. 8 is a waveform diagram of the pulse electric current for a spiral orbit, and a Lissajous figure of rotating plasma describing a spiral orbit. When the pulse current of the time variable amplitude is expressed as sine wave $Am(t)\sin 2\pi ft$ ($Am(t)$: time-variable amplitude; f: frequency; t: time), the pulse currents of X-direction and Y-direction supplied to respective deflecting coils become $Ax(t)\sin 2\pi ft$ and $Ay(t)\cos 2\pi ft$, respectively. (8A) of FIG. 8 shows one period of current wave form $Ax(t)\sin 2\pi ft$, and a supply of pulsed current of this waveform is made repeatedly. A pulse current of $Ay(t)\cos 2\pi ft$ is supplied as a similar waveform, but with 90° phase difference. In the case of (8A), trace A1 of the amplitude peak values is approximated by at, and the amplitude varies linearly. Therefore, when a pulse supply of $Ax(t)\sin 2\pi ft$ and $Ay(t)\cos 2\pi ft$ are done along with the frequency variable control, a rotating plasma whose orbiting speed becomes different in each rotation angle region, and furthermore, describes a spiral orbit, can be generated. That is to say, by means of the pulsed current supply with time variable amplitude in (8A), as shown in Lissajous figure of (8B) in FIG. 8, a rotating plasma rotating in the inner and outer circumferences regularly in a given time period and describing a spiral orbit can be obtained.

FIG. 9 is a waveform diagram of the pulse electric current for a different spiral orbit, and a Lissajous figure of rotating plasma describing a spiral orbit. (9A) of FIG. 9, in a similar manner as (8A), shows one period of the current wave form of a sine wave, and supply of pulsed current of this waveform is done repeatedly. In the case of (9A), trace A2 of the amplitude peak values is approximated by logs, and the amplitude is varied curvilinearly. Therefore, when the pulse supply of said current wave forms $Ax(t)\sin 2\pi ft$, $Ay(t)\cos 2\pi ft$ is done along with said frequency variable control, a rotating plasma can be generated, in which the orbiting speed differs according to the rotation angle region, and moreover, a spiral orbit different from the case in FIG. 8 is described. That is to say, the rotating plasma in (8B) rotates within the spiral orbit around the inner and outer circumferences in a constant time interval, but as shown in (9B), rotating plasma describing a spiral orbit that is dense in the outer circumference side can be obtained. When a rotating plasma describing said spiral orbit is used, it becomes possible to form a film, so that the film thicknesses are different at the inner circumference and the outer circumference portions of an object to be treated. For example, one may consider a case in which a medium for a hard disk drive is used as the object to be treated, and the film is formed more thickly at the load-unload zone at the outer circumference side that requires durability higher than the data zone at the inner circumference side. Previously, two steps were required, in which after a film is formed on the whole disc once, another film formation is done again at the outer circumference portion for thickness. In contrast, by the single plasma treatment step, a plasma treatment can be done, in which a desired height difference is provided in the film formation thicknesses at the inside and the outside circumferences, in high quality.

In addition, to vary the amplitude curvilinearly, the trace of the amplitude peak values may be approximated by exp(t).

The present invention is not limited to the embodiments described above. Various modifications, design alterations, and others that do not involve a departure from the technical concept of the present invention are also included in the technical scope of the present invention.

INDUSTRIAL APPLICABILITY

According to the present invention, a control becomes possible of plasma treatment using rotating plasma, and it contributes to an improvement in the plasma treatment. Therefore, for example, it becomes possible to form homogeneously in plasma a film of high purity in which there are a markedly few defects and impurities on the surface of a solid material, or reforming evenly in plasma the solid surface characteristics without adding defects and impurities. Therefore, a plasma processing apparatus can be provided, in which an abrasion resistance/corrosion resistance reinforcement film, a protective film, an optical thin film, a transparent conductive film and such can be formed in high quality and precision on a solid surface.

DENOTATION OF REFERENCE NUMERALS

1 Plasma generation apparatus
2 Cathode
3 Anode
4 Plasma generating portion
5 Striker
6 Plasma advancing path
7 Bending portion
8 Bending magnetic field generator
9 Droplet advancing path
10 Droplet collecting portion
11 Arc power supply
12 Cathode protector
13 Plasma stabilizing magnetic field generator
14 Connecting advancing path
15 Baffle
16 Baffle
17 Baffle
18 Baffle
19 Magnetic field generator
20 Plasma advancing path
21 Radially enlarged tube
21a Starting end
21b Starting end
22 Introduction side radially reduced tube
23 Magnetic field generator
24 Magnetic field generator
25 Aperture
26 Baffle
27 Discharge side radially reduced tube
28 Plasma treatment chamber
29 Object to be treated
30 Magnetic field generator
31 Aperture
32 Inner circumferential tube 33 Outer circumferential tube
34 Step portion
35 Step portion
36 Magnetic field generator
37 Magnetic field generator
38 Plasma stream
39 Arrow
100 PLC
101 Touch panel display
102 Stabilized DC power supply
103 Pulse generator
103a DC servo amplifier
103b DC servo amplifier

The invention claimed is:

1. A plasma stream generation method, characterized in that
a supply source of a plasma constituent material is set up as a cathode,
an anode is arranged in front or circumference of said cathode,
an arc plasma is generated between said cathode and said anode by generation of an arc discharge,
a plasma stream is generated by letting said arc plasma pass through a plasma distribution pathway,
said plasma stream is made rotating around a plasma traveling direction by a rotation magnetic field,
where
when an imbalance occurs in a plasma density distribution along a beam cross section of said plasma stream and said beam cross section is a deformed cross section having an extended-axis direction and a shortened-axis direction,
an object to be treated in a plasma treatment is irradiated with said plasma stream being made rotating around said plasma travelling direction while varying its rotational velocity describing a rotational orbit,
so that said plasma treatment is carried out while making a film formation thickness uniform along said rotational orbit,
and
said plasma stream generation method comprises at least the steps of:
(a) partitioning a whole circular rotation angle region of plasma around said plasma traveling direction into two or more;
(b) setting a frequency for each divided rotation angle region;
(c) executing a frequency variation control of rotating plasma generation,
wherein
said frequency in respective rotation angle region is made to be different, in such a manner that an orbiting speed of said plasma stream is slow in a rotation angle region where said shortened-axis direction is along said rotational orbit, and an orbiting speed of said plasma stream is fast in a rotation angle region where said extended-axis direction is along said rotational orbit.

2. The plasma stream generation method according to claim 1, wherein
an X-direction magnetic field set up in said plasma distribution pathway is generated,
a Y-direction magnetic field perpendicular to said X-direction is generated, and
said X-direction magnetic field and/or said Y-direction magnetic field is varied according to said rotation angle region, thus varying said rotational velocity of a plasma stream in said rotation angle region,
so that
a plasma stream describing a circular orbit, an elliptical orbit, or a spiral orbit is generated.

3. The plasma stream generation method according to claim 1 or 2, wherein said whole circular rotation angle region is partitioned into 4n portions, wherein n is a positive integer.

4. A plasma processing method, characterized in that a plasma treatment is done by supplying to an object to be treated a plasma stream generated by said plasma stream generation method according to claim 1 or 2.

5. The plasma processing method according to claim 4, wherein
when a film is formed on an inner circumference portion and an outer circumference portion of said object to be treated,
a plasma treatment is done by a plasma stream having a rotation angle region in which said rotational velocity is varying, in such a manner that film thicknesses of said inner circumference portion and said outer circumference portion are made to become different.

6. A plasma generation apparatus for generating a plasma stream, comprising:
a supply source of a plasma constituent material being set up as a cathode;
an anode being arranged in front or circumference of said cathode;
an arc plasma being generated between said cathode and said anode by generation of an arc discharge;
said plasma stream being generated by letting said arc plasma pass through a plasma distribution pathway;
said plasma stream being made rotating around a plasma traveling direction by a rotation magnetic field;
a programmable logic controller;
a setting input means for inputting and setting a rotation control parameter;
said setting input means being connected to said programmable logic controller:
said rotation control parameter including a frequency and amplitude data for each rotation angle region when a whole circular rotation angle region of plasma around said plasma traveling direction is partitioned into two or more; and
said programmable logic controller executing a frequency variation control of rotating plasma generation with said rotation control parameter,
where
when an imbalance occurs in a plasma density distribution along a beam cross section of said plasma stream and said beam cross section is a deformed cross section having an extended-axis direction and a shortened-axis direction,
an object to be treated in a plasma treatment is irradiated with said plasma stream being made rotating around said plasma travelling direction while varying its rotational velocity describing a rotational orbit,
so that
said plasma treatment is carried out while making a film formation thickness uniform along said rotational orbit,
wherein
said frequency variation control of rotating plasma generation is executed in such a manner that said frequency in respective rotation angle region is made to be different, and that an orbiting speed of said plasma stream is slow in a rotation angle region where said shortened-axis direction is along said rotational orbit, and an orbiting speed of said plasma stream is fast in a rotation angle region where said extended-axis direction is along said rotational orbit.

7. The plasma generation apparatus according to claim 6, wherein said plasma generation apparatus comprises
an X-direction magnetic field generating means that generates an X-direction magnetic field set up in said plasma distribution pathway, and
a Y-direction magnetic field generating means that generates a Y-direction magnetic field perpendicular to said X-direction,
so that
said X-direction magnetic field and/or said Y-direction magnetic field is varied according to said rotation angle region,
thus varying said rotational velocity of a plasma stream in said rotation angle region,
consequently generating a plasma stream describing a circular orbit, an elliptical orbit, or a spiral orbit.

8. The plasma generation apparatus according to claim 6 or 7, wherein said whole circular rotation angle region is partitioned into 4n portions, wherein n is a positive integer.

9. A plasma processing apparatus, comprising:
said plasma generation apparatus according to claim 6 or 7,
a plasma transport tube that transports a plasma generated by said plasma generation apparatus, and
a plasma processing portion that processes an object to be treated by said plasma supplied from said plasma transport tube.

10. A plasma processing apparatus comprising:
said plasma generation apparatus according to claim 7;
a plasma transport tube that transports a plasma generated by said plasma generation apparatus;
a plasma processing portion that processes an object to be treated by said plasma supplied from said plasma transport tube; and
a means for changing with respect to time amplitudes of pulse currents supplied to said X-direction magnetic field generating means and said Y-direction magnetic field generating means in such a manner that
when a film is formed on an inner circumference portion and an outer circumference portion of said object to be treated,
film thicknesses of said inner circumference portion and said outer circumference portion are made to become different, by using said plasma stream having a rotation angle region in which said rotational velocity is varying.

* * * * *